United States Patent
Song

(10) Patent No.: US 9,396,818 B2
(45) Date of Patent: Jul. 19, 2016

(54) SEMICONDUCTOR MEMORY DEVICE AND OPERATION METHOD THEREOF

(71) Applicant: SK hynix Inc., Gyeonggi-do (KR)

(72) Inventor: Choung-Ki Song, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 36 days.

(21) Appl. No.: 14/319,966

(22) Filed: Jun. 30, 2014

(65) Prior Publication Data

US 2015/0243375 A1    Aug. 27, 2015

(30) Foreign Application Priority Data

Feb. 21, 2014  (KR) ........................ 10-2014-0020247

(51) Int. Cl.
  *G11C 29/00* (2006.01)
  *G11C 11/406* (2006.01)
  *G11C 17/16* (2006.01)
(52) U.S. Cl.
  CPC ............ *G11C 29/783* (2013.01); *G11C 11/406* (2013.01); *G11C 17/16* (2013.01)
(58) Field of Classification Search
  CPC ..... G11C 29/783; G11C 17/16; G11C 11/406
  USPC .................................................. 365/96, 200
  See application file for complete search history.

(56) References Cited

U.S. PATENT DOCUMENTS

2013/0223171 A1* 8/2013 Kim ........................ G11C 29/04
                                                      365/200
2013/0322160 A1* 12/2013 Kim ........................ G11C 29/04
                                                      365/154

FOREIGN PATENT DOCUMENTS

KR       1020040001490        1/2004

* cited by examiner

Primary Examiner — Hoai V Ho
Assistant Examiner — Tri Hoang
(74) Attorney, Agent, or Firm — IP & T Group LLP

(57) ABSTRACT

A semiconductor memory device includes a memory cell array including a plurality of memory cells and a plurality of redundancy memory cells, a fuse array to be programmed with information of a defective memory cell among the memory cells of the memory cell array, and a control unit suitable for setting up a program operation section for programming the fuse array in response to an external command, wherein when the control unit sets up the program operation section, the control unit sets up a refresh operation section for refreshing the memory cell array, which is terminated before the program operation section ends without overlapping with the program operation section.

18 Claims, 5 Drawing Sheets

SEMICONDUCTOR MEMORY DEVICE AND OPERATION METHOD THEREOF

CROSS-REFERENCE TO RELATED APPLICATIONS

The present application claims priority of Korean Patent Application No. 10-2014-0020247, filed on Feb. 21, 2014, which is incorporated herein by reference in its entirety.

BACKGROUND

1. Field

Exemplary embodiments of the present invention relate to a semiconductor memory device, and more particularly, to a semiconductor memory device including a fuse array circuit, and an operation method thereof.

2. Description of the Related Art

A semiconductor memory device stores data in a plurality of memory cells that are arranged in a matrix. However, if only a single memory cell has a defect, the semiconductor memory device may malfunction.

As semiconductor memory devices are further integrated and operate faster, the number of defective memory cells may increase. If all semiconductor memory devices with defective memory cells were abandoned as defective products, the production yield of semiconductor memory devices would be deteriorated. To resolve such concern, industry and researchers are developing a semiconductor memory device capable of repairing a defective cell for improving the production yield as well as achieving high integration and faster operating rates.

To repair a defective memory cell, a semiconductor memory device may include redundancy memory cells, for repair, in addition to normal memory cells for performing general read and write operations. When a defect occurs in a normal memory cell among the normal memory cells, the defect may be repaired by substituting the defective memory cell with a redundancy memory cell. To be specific, the address of the normal memory cell, which is detected to have the defect, is stored, and then when the corresponding address is inputted, the redundancy memory cell corresponding to the defective memory cell is accessed.

The defective memory cell of a semiconductor memory device may be detected and repaired in the state of wafer. However, a defect in a semiconductor memory device may occur during the packaging process or burn-in test, which is performed after the packaging process. Thus, a defect in a semiconductor memory device needs to be detected and repaired even after the semiconductor memory device is packaged. This is generally referred to as a post-package repair (PPR) operation.

FIG. 1 is a block view illustrating a conventional semiconductor memory device. Referring to FIG. 1, a post-package repair operation of the conventional semiconductor memory device is described.

The semiconductor memory device 100 includes a program block 110, a repair block 120, a fuse array 130, and a memory cell array 140 including a plurality of memory cells.

The program block 110 may program the fuse array 130 in response to an external command CMD during a program mode. The program block 110 may program address information FADD of a defective memory cell among the memory cells included in the memory cell array 140.

The fuse array 130 includes a plurality of anti-fuses that may be ruptured. The fuse array 130 may program the address information FADD of the defective memory cell by selectively rupturing the anti-fuses. In the wafer stage, information may be programmed by selectively cutting a corresponding fuse with laser beam. The anti-fuses are provided because such operations cannot be performed in the package stage. Anti-fuses generally begin in an open state and may be short-circuited by applying a high voltage to break down the dielectric material within.

When the address information FADD of a defective memory cell is programmed, the repair block 120 compares an inputted address ADD with an address PADD programmed in the fuse array 130, and decides whether to substitute the normal memory cell of the memory cell array 140 corresponding to the inputted address ADD with a redundancy memory cell based on the address comparison result to output the decision result as a signal N/R.

FIG. 2 is a timing diagram for describing an operation of a conventional semiconductor memory device 100 shown in FIG. 1. Referring to FIG. 2, the conventional semiconductor memory device 100 may enter a program mode through a mode register set (MRS) operation, and perform a program operation based on the address inputted along with an active command ACT, in response to a write command WR for data DQ having a predetermined logic level. The program operation may be performed while a program enable signal PGM_EN is activated. That is, the program mode may be defined by an activation period of the program enable signal PGM_EN.

In a conventional semiconductor memory device 100, when a program operation is performed on the fuse array 130 and a refresh operation command REF for the memory cell array 140 is inputted in the middle of the program operation, the refresh operation command REF is ignored and the program operation is performed continuously. This is because when a refresh operation for enabling a plurality of word lines is performed together with the program operation where a fuse is ruptured using high voltage, the currents induced from the operations are added to raise the peak current value. Since high peak current affects both the program operation and the refresh operation, as illustrated in FIG. 2, the refresh operation command REF is disregarded while performing the program operation on the fuse array 130.

However, disregarding of the refresh operation command REF affects how long the memory cells are required to retain data without being refreshed, potentially allowing data in the memory cells to be lost. For example, when 100 refresh operation commands REF are ignored, the data retention time of the cell would be approximately 780 µs. When 1000 refresh operation commands REF are ignored, the data retention time of the cell would be approximately 7.8 ms. Since a program operation of the fuse array 130 may reach hundreds of milliseconds, the increased data retention time of the cell raises the possibility of data loss.

SUMMARY

Various embodiments of the present invention are directed to a semiconductor memory device including a fuse array circuit that may be secured with data reliability, and an operation method thereof.

In accordance with an embodiment of the present invention, a semiconductor memory device may include a memory cell array including a plurality of memory cells and a plurality of redundancy memory cells; a fuse array to be programmed with information of a defective memory cell among the memory cells of the memory cell array; and a control unit suitable for setting up a program operation section for programming the fuse array in response to an external command;

wherein when the control unit sets up the program operation section, the control unit sets up a refresh operation section for refreshing the memory cell array, which is to be terminated before the program operation section ends without overlapping with the program operation section.

In accordance with an embodiment of the present invention, a semiconductor memory device may include a memory cell array including a plurality of memory cells; a fuse array including a plurality of fuses; a program unit suitable for programming operation information in the fuse array in response to a program control signal; a refresh control unit suitable for performing refresh operations on the memory cells in response to a refresh control signal; and a control unit suitable for generating the program control signal and the refresh control signal having activation sections that do not overlap with the program control signal, in response to an external command signal, wherein the activation section of the refresh control signal comes ahead of an activation section of the first control signal or between two activation sections of the program control signal.

In accordance with an embodiment of the present invention, an operation method of a semiconductor memory device may include entering a program operation mode for programming a fuse array based on a command signal; setting up a refresh operation section for performing a refresh operation on a memory cell array and setting up a program operation section for performing a program operation on the fuse array to include the refresh operation section; and performing the refresh operation on the memory cell array and the program operation on the fuse array based on the refresh and program operation sections.

DETAILED DESCRIPTION

Figure 1:
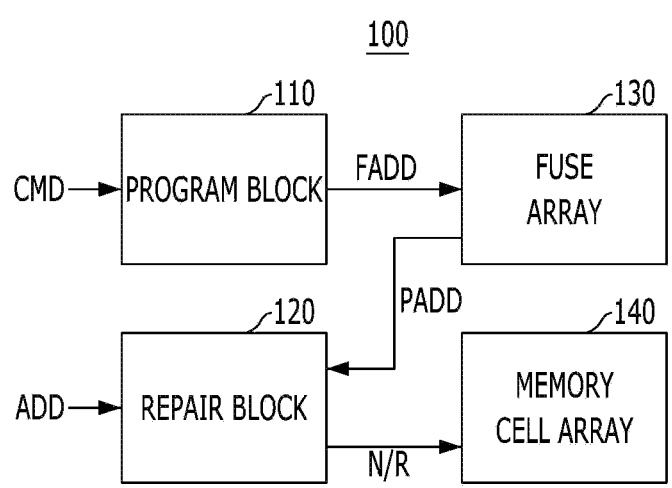
FIG. 1 is a block view illustrating a conventional semiconductor memory device.
Figure 2:
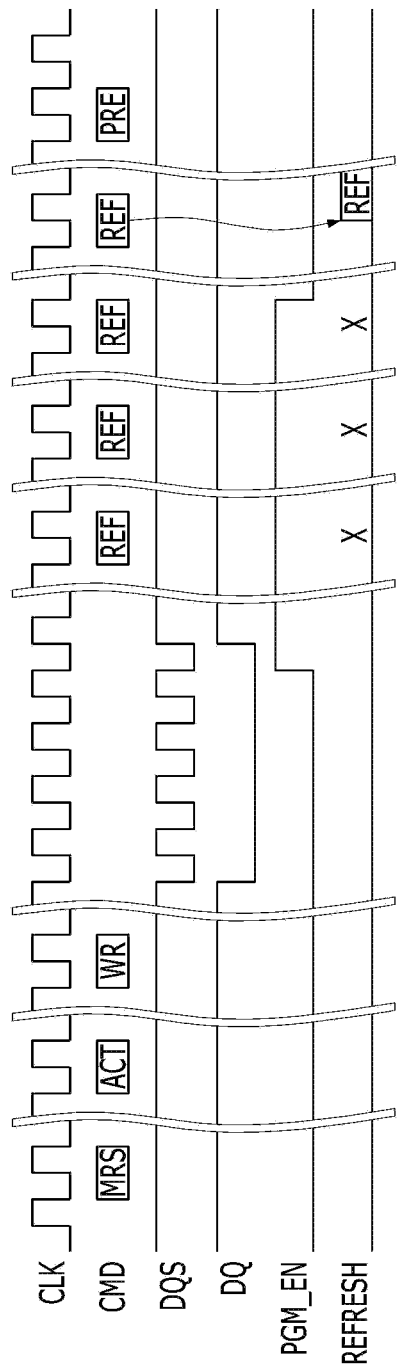
FIG. 2 is a timing diagram for describing an operation of the semiconductor memory device shown in FIG. 1.

Exemplary embodiments of the present invention will be described below in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like numbered parts in the various figures and embodiments of the present invention.

The drawings are not necessarily to scale and, in some instances, proportions may have been exaggerated to dearly illustrate features of the embodiments.

In this specification, specific terms have been used. The terms are used to describe the present invention and are not used to qualify the sense or limit the scope of the present invention. It is also noted that in this specification, 'and/or' represents that one or more components arranged before and after 'and/or' is included. Furthermore, "connected/coupled" refers to one component not only directly coupling another component but also indirectly coupling another component through an intermediate component. In addition, a singular form may include the plural form, and vice versa, as long as it is not specifically mentioned. Furthermore 'include/comprise' or 'including/comprising' used in the specification represents that one or more components, steps, operations, and elements exists or are added.

Figure 3:
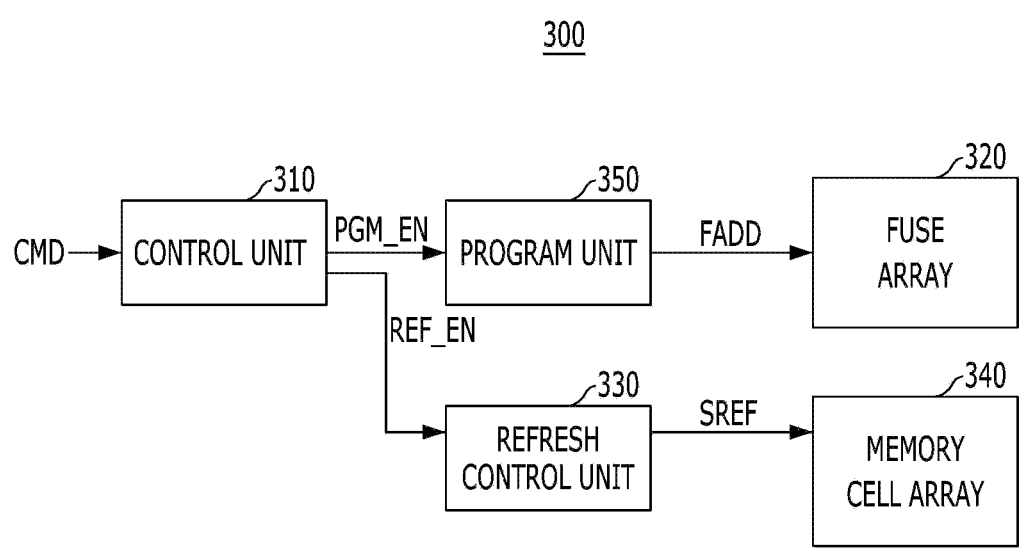
FIG. 3 is a block view illustrating a semiconductor memory device in accordance with an embodiment of the present invention.

FIG. 3 is a block view illustrating a semiconductor memory device 300 in accordance with an embodiment of the present invention. Referring to FIG. 3, the semiconductor memory device 300 may include a control unit 310, a program unit 350, a fuse array 320, a refresh control unit 330 and a memory cell array 340.

The control unit 310 may enable a program enable signal PGM_EN based on an external command CMD, set up a program operation section of the fuse array 320, and enable a refresh enable signal REF_EN. The program unit 350 programs the fuse array 320 in response to the program enable signal PGM_EN. Further, the program unit 350 may include a mode register set (MRS).

The fuse array 320 may include a plurality of anti-fuses or e-fuses. The information programmed in the fuse array 320 may include general information (i.e., operation information) for an operation of the semiconductor memory device 300, and address information FADD of a defective memory cell for performing a post-package repair operation.

The memory cell array 340 includes a plurality of memory cells and a plurality of redundancy memory cells. When a post-package repair operation is performed, a defective memory cell among the memory cells included in the memory cell array 340 may be replaced with a redundancy memory cell based on the address information FADD of the defective memory cell stored in the fuse array 320.

The refresh control unit 330 controls the refresh operation of the memory cells and the redundancy memory cells of the memory cell array 340 in response to the refresh enable signal REF_EN, which is outputted from the control unit 310, or the external command CMD. The refresh operation may include a self-refresh operation.

The control unit 310 sets up the program operation section of the fuse array 320 in response to the external command CMD. The control unit 310 may generate the refresh enable signal REF_EN and set up the refresh operation section to be terminated prior to the program operation section without overlapping with the program operation section. Therefore, the semiconductor memory device 300 may perform a refresh operation on the memory cell array 340 even in a program operation mode for programming the fuse array 320. That is, in the semiconductor memory device 300, a refresh operation may be performed on the memory cell array 340 before a program operation on the fuse array 320 ends. Thus, the required data retention time of the memory cells may be reduced to enable a higher degree of data reliability. Also, since the refresh operation on the memory cell array 340 is controlled not to overlap with the program operation on the fuse array 320, the program operation on the fuse array 320 may be performed stably as well.

Hereafter, an operation of the semiconductor memory device 300 in accordance with the embodiment of the present invention is described in detail by referring to a timing diagram.

Figure 4:
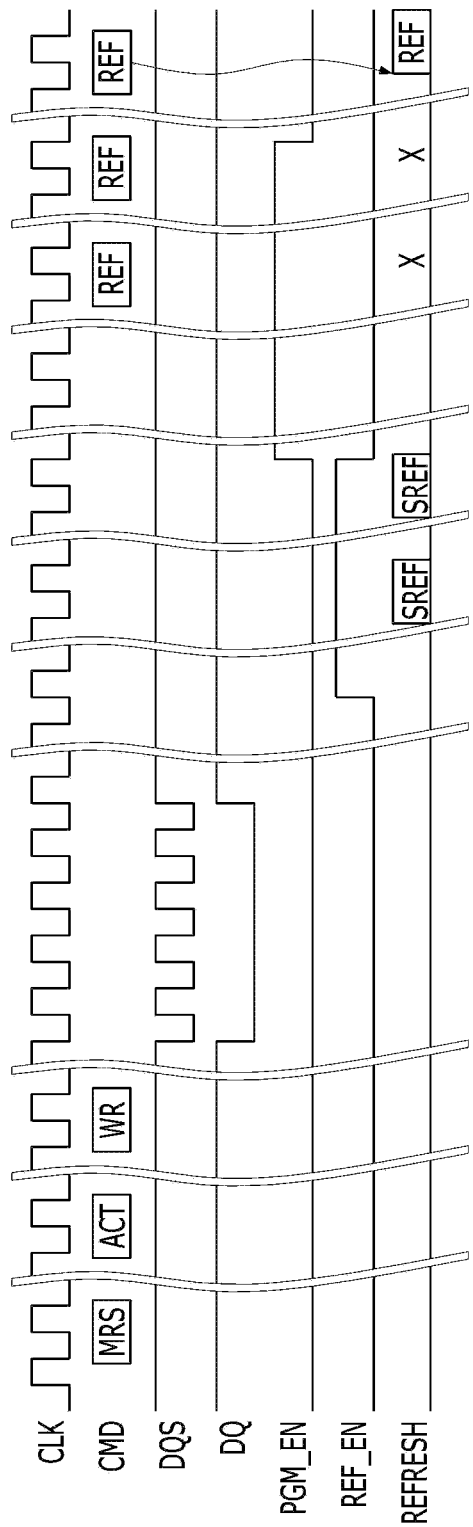
FIG. 4 is a timing diagram for describing an operation of the semiconductor memory device shown in FIG. 3.

FIG. 4 is a timing diagram for describing an operation of the semiconductor memory device 300 shown in FIG. 3.

The semiconductor memory device 300 may enter a program operation mode for programming the fuse array 320 upon receipt of the external command CMD. In other words, when a command directing to enter the program operation mode for programming the fuse array 320 is inputted, the control unit 310 enables the program enable signal PGM_EN to control the program unit 350 to program the fuse array 320.

Herein, as shown in FIG. 4, before the control unit 310 enables the program enable signal PGM_EN, a self-refresh operation is performed first on the memory cell array 340 by enabling the refresh enable signal REF_EN for a predetermined time. While the program enable signal PGM_EN is enabled and the fuse array 320 is programmed, a refresh command REF inputted from an external source may be disregarded to stably perform the program operation. Therefore, in accordance with the embodiment of the present invention, the refresh enable signal REF_EN may be enabled for a refresh operation section to be performed, or longer, by the refresh command REF.

The semiconductor memory device 300 in accordance with the embodiment of the present invention prevents data reliability of the memory cell array 340 from being deteriorated while the fuse array 320 is programmed through the post-package repair operation. To this end, the semiconductor memory device automatically sets up a refresh operation section for refreshing the memory cell array 340 before the program operation section for programming the fuse array 320.

Figure 5:
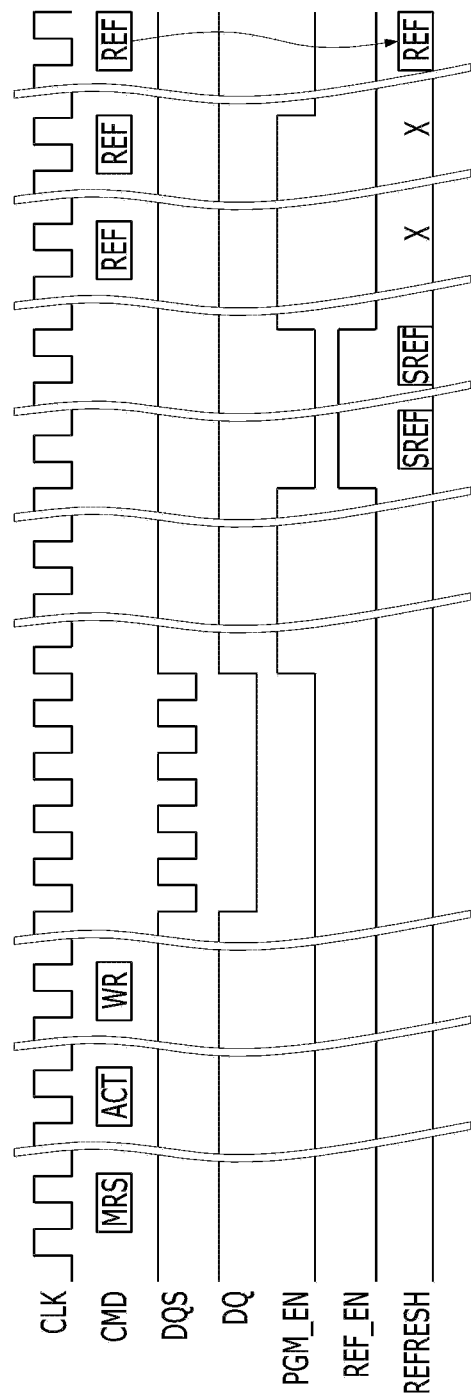
FIG. 5 is a timing diagram for describing an operation of the semiconductor memory device shown in FIG. 3.

FIG. 5 is a timing diagram for describing an operation of the semiconductor memory device 300 shown in FIG. 3.

In the timing diagram of FIG. 4, the control unit 310 enables the refresh enable signal REF_EN before the control unit 310 enables the program enable signal PGM_EN. However, in the timing diagram of FIG. 5, the control unit 310 enables the program enable signal PGM_EN first in response to the external command CMD and then enables the refresh enable signal REF_EN in the middle of the section where the program enable signal PGM_EN is enabled. Therefore, it is possible to prevent data loss that may occur because the refresh operation for the memory cell array 340 is not performed until the program operation for programming the fuse array 320 ends.

Also, in the section where the refresh enable signal REF_EN is enabled, the program enable signal PGM_EN is disabled temporarily in order to prevent the peak current from being increased due to simultaneous performance of the program operation and the refresh operation. Since the semiconductor memory devices shown in FIGS. 4 and 5 all operate at the same timing in other operations, a further description will be omitted.

As described above, the semiconductor memory devices in accordance with the embodiments of the present invention may prevent data stability of a memory cell array from being deteriorated while a fuse array is programmed by setting up a refresh operation section of the memory cell array within a program operation section for programming a fuse array to perform a post-package repair operation. In addition, the semiconductor memory devices in accordance with the embodiments of the present invention are capable of stably controlling the program operation section of the fuse array based on the refresh operation section of the memory cell array.

While the present invention has been described with respect to the specific embodiments, it will be apparent to those skilled in the art that various changes and modifications may be made without departing from the spirit and scope of the invention as defined in the following claims.

What is claimed is:

1. A semiconductor memory device, comprising:
   a memory cell array including a plurality of memory cells and a plurality of redundancy memory cells;
   a fuse array to be programmed with information of a defective memory cell among the memory cells of the memory cell array; and
   a control unit suitable for setting up a program operation section for programming the fuse array in response to an external command,
   wherein when the control unit sets up the program operation section, the control unit sets up a refresh operation section for refreshing the memory cell array, which is to be terminated before the program operation section ends without overlapping with the program operation section, and
   wherein the control unit controls the memory cell array to be refreshed while stopping the fuse array from being programmed.

2. The semiconductor memory device of claim 1, wherein the control unit sets the refresh operation section before the program operation section and controls a refresh operation on the memory cell array to be performed prior to a program operation on the fuse array.

3. The semiconductor memory device of claim 1, wherein the control unit sets the refresh operation section in the middle of the program operation section so that a program operation on the fuse array is performed first and then the program operation stops while a refresh operation on the memory cell array is performed, and then the program operation is resumed.

4. The semiconductor memory device of claim 1, wherein a refresh operation of the memory cell array in response to an external refresh command is ignored during the program operation section, and the refresh operation section set up by the control unit corresponds to a section of the refresh operation ignored.

5. The semiconductor memory device of claim 1, wherein the control unit generates a program control signal and a refresh control signal having activation sections that do not overlap with the program control signal, in response to the external command, and
   the activation section of the refresh control signal comes before an activation section of the program control signal or between two activation sections of the program control signal.

6. The semiconductor memory device of claim 5, further comprising:
   a program unit suitable for programming the information of the defective memory cell in the fuse array in response to the program control signal; and
   a refresh control unit suitable for performing refresh operations on the memory cells and the redundancy memory cells of the memory cell array in response to the refresh control signal.

7. The semiconductor memory device of claim 1, wherein the defective memory cell among the memory cells of the memory cell array is substituted with a redundancy memory cell among the redundancy memory cells based on the information of the defective memory cell.

8. The semiconductor memory device of claim 1, wherein the fuse array includes a plurality of anti-fuses or e-fuses.

9. A semiconductor memory device, comprising:
   a memory cell array including a plurality of memory cells;
   a fuse array including a plurality of fuses;

a program unit suitable for programming operation information in the fuse array in response to a program control signal;

a refresh control unit suitable for performing refresh operations on the memory cells in response to a refresh control signal; and a control unit suitable for generating the program control signal and the refresh control signal having activation sections that do not overlap with the program control signal, in response to an external command signal, wherein the activation section of the refresh control signal comes ahead of an activation section of the program control signal or between activation sections of the program control signal, and wherein the control unit controls the refresh control unit to perform the refresh operations while stopping the program unit from programming the fuse array.

10. The semiconductor memory device of claim 9, wherein a refresh operation of the memory cell array in response to an external refresh command is ignored during the program operation section, and the refresh operation section set up by the control unit corresponds to a section of the refresh operation ignored.

11. The semiconductor memory device of claim 9, wherein the operation information includes address information of a defective memory cell included in the memory cell array.

12. An operation method of a semiconductor memory device, comprising:

entering a program operation mode for programming a fuse array based on a command signal;

setting up a refresh operation section for performing a refresh operation on a memory cell array and setting up a program operation section for performing a program operation on the fuse array to include the refresh operation section; and performing the refresh operation on the memory cell array and the program operation on the fuse array based on the refresh and program operation sections by controlling the refresh operation to be performed while stopping the program operation.

13. The operation method of claim 12, wherein in the setting up of the program operation section for performing the program operation on the fuse array, the program operation section of the fuse array is set up subsequent to the refresh operation section of the memory cell array.

14. The operation method of claim 13, wherein the performing of the refresh operation on the memory cell array and the program operation on the fuse array includes:

performing the refresh operation on the memory cell array; and performing the program operation on the fuse array when the refresh operation is completed.

15. The operation method of claim 12, wherein in the setting up of the program operation section for performing the program operation on the fuse array, the refresh operation section of the memory cell array is set between program operation sections of the fuse array.

16. The operation method of claim 15, wherein the performing of the refresh operation on the memory cell array and the program operation on the fuse array includes:

performing the program operation on the fuse array;

delaying the program operation and performing the refresh operation on the memory cell array; and resuming the program operation, when the refresh operation is completed.

17. The operation method of claim 12, wherein the performing of the refresh operation on the memory cell array and the program operation on the fuse array further includes:

ignoring an external refresh command inputted from an external source.

18. The operation method of claim 17, wherein the refresh operation section of the memory cell array is set up corresponding to an operation section for the ignored external refresh command.

* * * * *